US006460174B1

(12) United States Patent
Carey

(10) Patent No.: US 6,460,174 B1
(45) Date of Patent: Oct. 1, 2002

(54) METHODS AND MODELS FOR USE IN DESIGNING AN INTEGRATED CIRCUIT

(75) Inventor: John A. Carey, Bristol (GB)

(73) Assignee: STMicroelectronics, Ltd. (GB)

( * ) Notice: Subject to any disclaimer, the term of this patent is extended or adjusted under 35 U.S.C. 154(b) by 0 days.

(21) Appl. No.: 09/410,641

(22) Filed: Oct. 1, 1999

(51) Int. Cl.[7] .............................................. G06F 17/50
(52) U.S. Cl. ........................................................ 716/18
(58) Field of Search .................................... 716/1–21

(56) References Cited

U.S. PATENT DOCUMENTS

| | | | |
|---|---|---|---|
| 4,814,981 A | 3/1989 | Rubinfeld | 364/200 |
| 5,251,311 A | 10/1993 | Kasai | 395/425 |
| 5,386,565 A | 1/1995 | Tanaka et al. | 395/700 |
| 5,423,050 A | 6/1995 | Taylor et al. | 395/575 |
| 5,434,804 A | 7/1995 | Bock et al. | 364/579 |
| 5,440,705 A | 8/1995 | Wang et al. | 395/421.1 |
| 5,448,576 A | 9/1995 | Russell | 371/22.3 |
| 5,452,432 A | 9/1995 | Macachor | 395/425 |
| 5,455,936 A | 10/1995 | Maemura | 395/183.11 |
| 5,479,652 A | 12/1995 | Dreyer et al. | 395/183.06 |
| 5,483,518 A | 1/1996 | Whetsel | 370/13 |
| 5,488,688 A | 1/1996 | Gonzales et al. | 395/183.1 |
| 5,530,965 A | 6/1996 | Kawasaki et al. | 395/800 |
| 5,570,375 A | 10/1996 | Tsai et al. | 371/22.3 |
| 5,590,354 A | 12/1996 | Klapproth et al. | 395/800 |
| 5,596,734 A | 1/1997 | Ferra | 395/825 |
| 5,598,551 A | 1/1997 | Barajas et al. | 395/484 |
| 5,608,881 A | 3/1997 | Masumura et al. | 395/306 |
| 5,613,153 A | 3/1997 | Arimilli et al. | 395/821 |
| 5,627,842 A | 5/1997 | Brown et al. | 371/22.3 |
| 5,657,273 A | 8/1997 | Ayukawa et al. | 395/189.01 |

(List continued on next page.)

FOREIGN PATENT DOCUMENTS

| | | | | |
|---|---|---|---|---|
| EP | 0165600 B1 | 11/1991 | | G06F/13/36 |
| EP | 0636976 B1 | 2/1995 | | G06F/11/00 |
| EP | 0636976 A1 | 2/1995 | | G06F/11/00 |
| EP | 0652516 A1 | 5/1995 | | G06F/11/00 |
| EP | 0702239 A2 | 3/1996 | | G01R/31/3173 |
| EP | 0720092 A1 | 7/1996 | | G06F/11/00 |
| EP | 0933926 A1 | 8/1999 | | H04N/5/00 |
| EP | 0945805 A1 | 9/1999 | | G06F/12/08 |
| EP | 0959411 A1 | 11/1999 | | G06F/13/24 |
| JP | PCT/JP96/02819 | 9/1996 | | G06F/9/46 |
| JP | 8320796 A | 12/1996 | | G06F/9/46 |
| JP | 8329687 A | 12/1996 | | G11C/15/00 |
| JP | 9212358 A | 8/1997 | | G06F/9/38 |
| JP | 9311786 A | 12/1997 | | G06F/9/38 |
| JP | 10106269 A | 4/1998 | | G06F/12/08 |
| JP | 10124484 A | 5/1998 | | G06F/17/10 |
| JP | 10177520 A | 6/1998 | | G06F/12/10 |

OTHER PUBLICATIONS

Richard York; Real Time Debug for System–on–Chip Devices; Jun. 1999, pp. 1–6.

*Primary Examiner*—Matthews Smith
*Assistant Examiner*—Thuan Do
(74) *Attorney, Agent, or Firm*—Lisa K. Jorgenson; William A. Munck

(57) ABSTRACT

A method of designing an integrated circuit comprising at least one requester and at least one target, said at least one requester and at least one target being connected by a connection network, said method comprising the steps of defining at least one parameter for said at least one requester to model said requester; defining at least one parameter for said at least one target to model said target; defining connection information for said connection network to model said network; and producing from said defined parameters and connection information implementation information for implementing said system.

32 Claims, 6 Drawing Sheets

U.S. PATENT DOCUMENTS

| | | | |
|---|---|---|---|
| 5,682,545 A | 10/1997 | Kawasaki et al. | 395/800 |
| 5,704,034 A | 12/1997 | Circello | 395/183.14 |
| 5,708,773 A | 1/1998 | Jeppesen, III et al. | 395/183.06 |
| 5,724,549 A | 3/1998 | Selgas et al. | 395/468 |
| 5,737,516 A | 4/1998 | Circello et al. | 395/183.14 |
| 5,751,621 A | 5/1998 | Arakawa | 364/748.07 |
| 5,768,152 A | 6/1998 | Battaline et al. | 364/551.01 |
| 5,771,240 A | 6/1998 | Tobin et al. | 371/22.1 |
| 5,774,701 A | 6/1998 | Matsui et al. | 395/556 |
| 5,778,237 A | 7/1998 | Yamamoto et al. | 395/750.04 |
| 5,781,558 A | 7/1998 | Inglis et al. | 371/21.1 |
| 5,796,978 A | 8/1998 | Yoshioka et al. | 395/416 |
| 5,828,825 A | 10/1998 | Eskandari et al. | 395/183.03 |
| 5,832,248 A | 11/1998 | Kishi et al. | 395/376 |
| 5,835,963 A | 11/1998 | Yoshioka et al. | 711/207 |
| 5,848,247 A | 12/1998 | Matsui et al. | 395/284 |
| 5,860,127 A | 1/1999 | Shimazaki et al. | 711/167 |
| 5,862,387 A | 1/1999 | Songer et al. | 395/728 |
| 5,867,726 A | 2/1999 | Ohsuga et al. | 395/800.32 |
| 5,884,092 A | 3/1999 | Kiuchi et al. | 395/800.35 |
| 5,896,550 A | 4/1999 | Wehunt et al. | 395/846 |
| 5,918,045 A | 6/1999 | Nishii et al. | 395/584 |
| 5,930,523 A | 7/1999 | Kawasaki et al. | 395/800.32 |
| 5,930,833 A | 7/1999 | Yoshioka et al. | 711/210 |
| 5,944,841 A | 8/1999 | Christie | 714/38 |
| 5,950,012 A | 9/1999 | Shiell et al. | 395/712 |
| 5,953,538 A | 9/1999 | Duncan et al. | 395/842 |
| 5,956,477 A | 9/1999 | Ranson et al. | 395/183.06 |
| 5,978,874 A | 11/1999 | Singhal et al. | 710/107 |
| 5,978,902 A | 11/1999 | Mann | 712/227 |
| 5,983,017 A | 11/1999 | Kemp et al. | 395/704 |
| 5,983,379 A | 11/1999 | Warren | 714/727 |
| 6,134,516 A * | 10/2000 | Wang | 716/5 |

\* cited by examiner

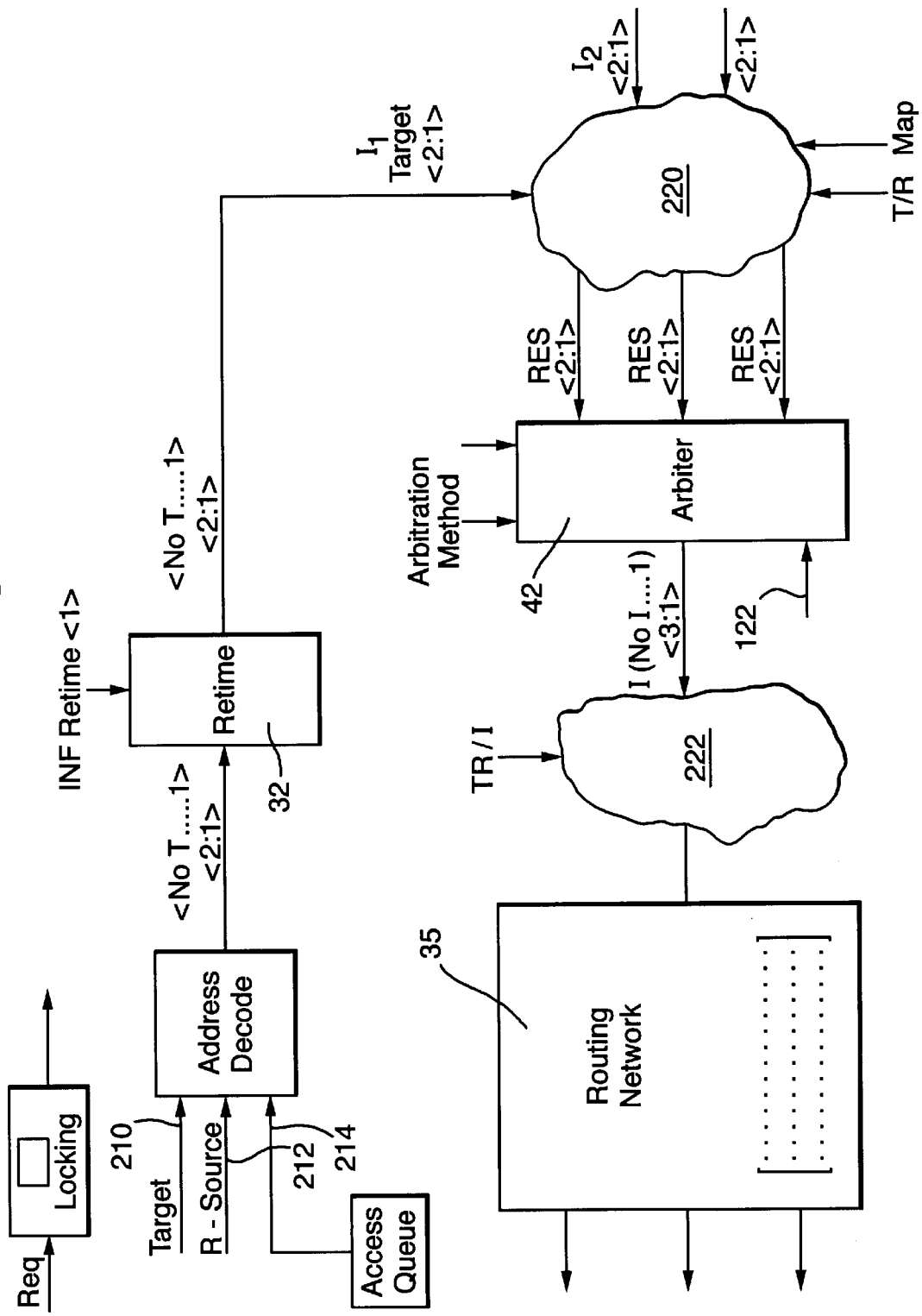

METHODS AND MODELS FOR USE IN DESIGNING AN INTEGRATED CIRCUIT

FIELD OF THE INVENTION

The present invention relates to a method of designing an integrated circuit and a model for use in designing an integrated circuit.

BACKGROUND OF THE INVENTION

As integrated circuits become more complicated, it has become harder to translate an initial design into a silicon design. In principle it is possible for the silicon design to be drawn up by an individual. However in practice, this is difficult for an individual designer to do as there are a huge number of components on a chip. One small error in the design may result in a faulty integrated circuit. Additionally, this process is very slow and can significantly delay the amount of time taken to get the integrated circuit to the manufacturing stage.

Various computer programs have been proposed to assist in the design of an integrated circuit and more particularly in the testing of a design. These computer programs have typically been in the form of digital simulators which simulate a circuit under test. A hardware description language (HDL) has been designed to simulate and describe the behaviour of digital circuitry. However, whilst programs such as HDL are useful in testing a design, they do not assist in the design of the integrated circuit itself.

Additionally, once the higher level design of an integrated circuit has been completed, it can be a laborious process to obtain the gate level design which provides the higher level function.

SUMMARY OF THE INVENTION

It is therefore an aim of embodiments of the present invention to provide a method which is able to reduce the amount of time required in order to design an integrated circuit.

According to one aspect of the present invention, there is provided a method of designing an integrated circuit comprising at least one requester and at least one target, said at least one requester and at least one target being connected by a connection network, said method comprising the steps of:

defining at least one parameter for said at least one requester to model said requester;

defining at least one parameter for said at least one target to model said target;

defining connection information for said connection network to model said network; and producing from said defined parameters and connection information implementation information for implementing said system.

According to a second aspect of the present invention, there is provided a model for use in designing an integrated circuit comprising at least one requester and at least one target connected by a connection network, said model comprising:

a requester model, one requester model being provided for each requester;

a target model, one target model being provided for each target; and a connection network model, wherein at least one of the requester model, the target model and the connection model have has one or more parameters defining the behaviour of the respective model, at least one of said parameters being selectable.

BRIEF DESCRIPTION OF THE DRAWINGS

For a better understanding of the present invention and as to how the same may be carried into effect, reference will now be made by way of example to the accompanying drawings in which:

FIG. 5 shows the target side of the model of FIG. 2 in more detail; and

DETAILED DESCRIPTION OF EMBODIMENTS OF THE PRESENT INVENTION

Figure 1:
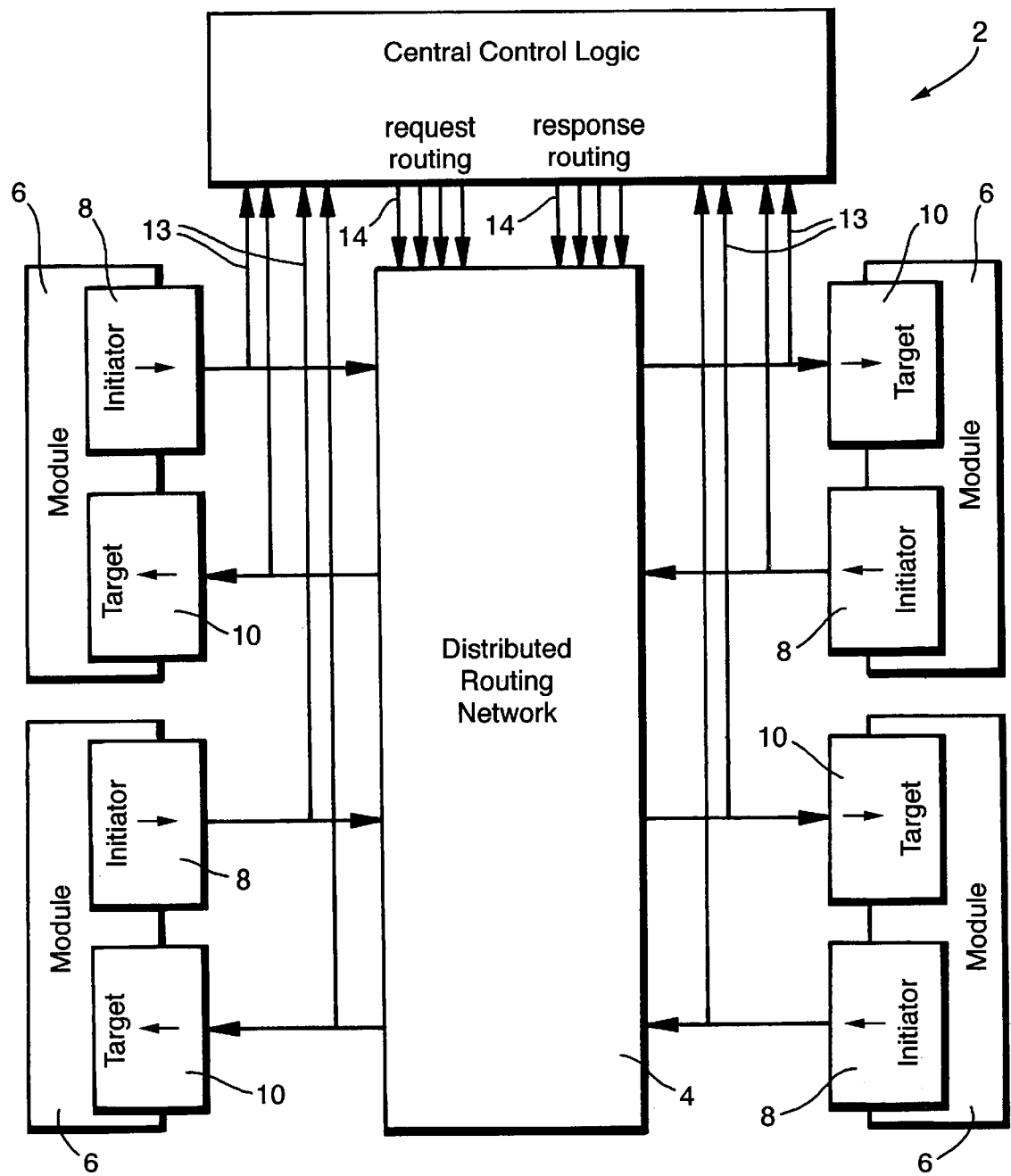
FIG. 1 shows a block diagram of the elements of a typical integrated circuit.

Reference will be made to FIG. 1 which schematically shows various components of an integrated circuit 2. The integrated circuit 2 has a distributed routing network 4. The distributed routing network 4 can be a series of dedicated connections, one or more shared connections or a mixture of dedicated and shared connections. One example of a shared connection is a bus.

A number of modules 6 are connected to the distributed routing network 4. Any number of modules can be connected to the routing network 4. The modules can be of any form. For example the modules may include one or more of the following modules: CPU; external memory interface; debug module; external interface circuitry; and the like.

Each module 6 has an initiator port 8 and a target port 10. The initiator ports 10 are arranged to output requests originating from the module 6 to the distributed routing network 4. The responses to the output requests are returned to the respective initiator port 10 via the distributed routing network 4. The target ports 10 are arranged to receive requests from the initiator ports 8 of other modules via the distributed network 4 and to output a response to the requesting module via the distributed network 4.

Each of the initiator ports 8 and the target ports 10 are connected to a central control logic 12 via lines 13 which controls the distributed routing network 4 via control signals 14. The central control logic arbitrates between the requests of the initiator ports 8 to determine which one or more requests are allowed onto the distributed routing network at a given time (for example a given cycle). A similar arbitration function may be provided for the responses of the target ports. The requests and the response may use the same or different routing resources in the distributed routing network 4.

To build a system on an integrated circuit it is necessary to link together macros which together define the system as a whole. Embodiments of the present invention are arranged to provide a macro which can be easily created and which reduce the design and verification resources required to build a system. The user defines the parameters for the model which will be described in more detail hereinafter. The resultant macro can then be included in the design for synthesis. The model can be customised to implement more sophisticated operations or to implement specific interconnect structures.

The model described hereinafter is designed to create interconnect nodes for bus interconnect architectures.

Figure 2:
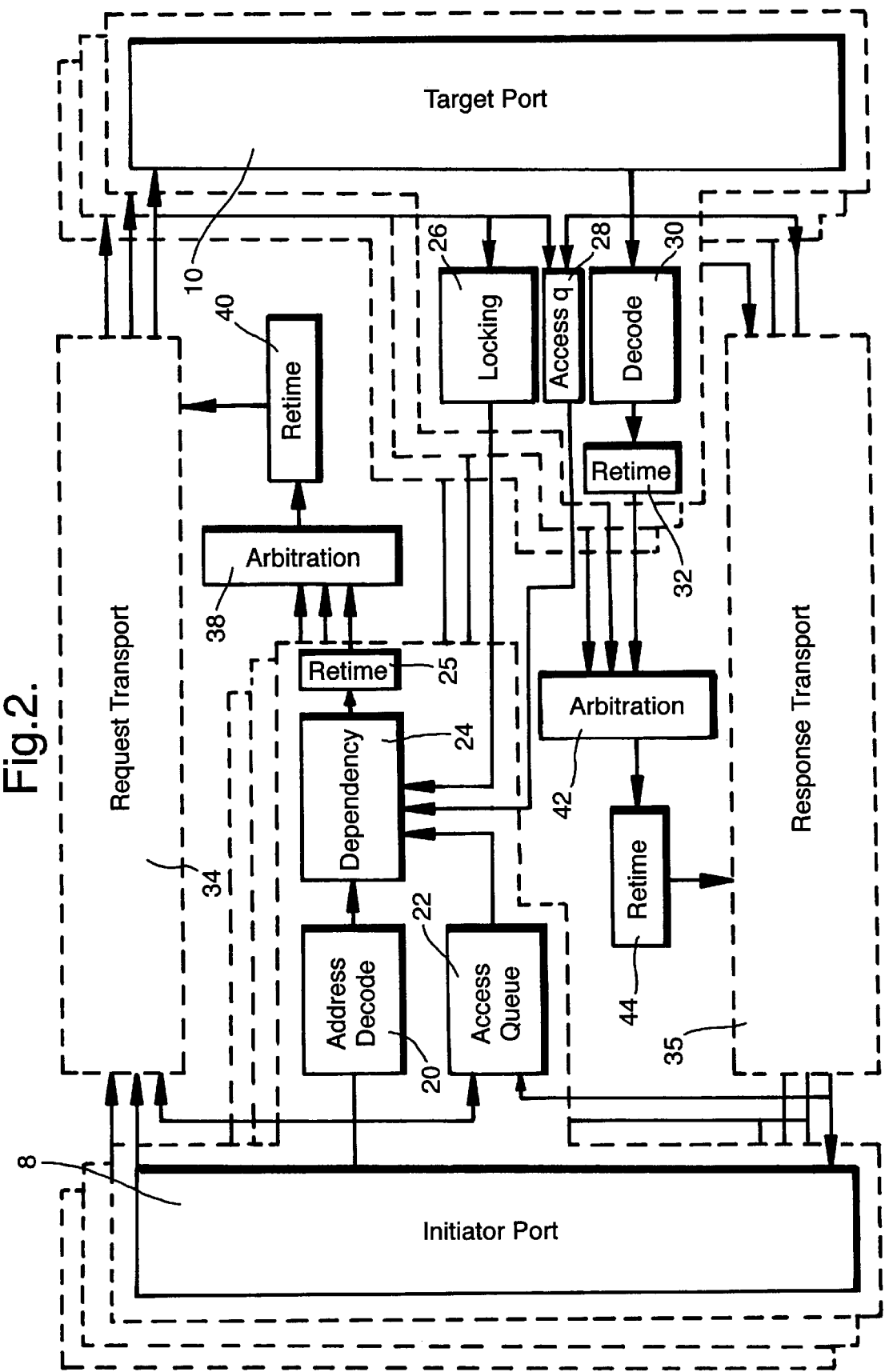
FIG. 2 shows a model for use in designing the implementation of the integrated circuit.

Reference is made to FIG. 2 which shows a model which is used to design an implementation of an integrated circuit having the structure of the circuit of FIG. 1. The model allows the characteristics of the elements to be defined and the organisation of the elements to be defined.

The model shown in FIG. 2 has an initiator port 8. The initiator port includes one or more of the following functional blocks:

address decode block 20;
access queue block 22;
dependency block 24; and
initiator retimer 25.

As will be appreciated, not all embodiments of the present invention require the initiator port to have these functional blocks.

The address decode block 20 is connected to the main part of the initiator port. The output of the address code block is connected to the dependency block 24 as is the output of the access queue block 22. The access queue block receives an input from the main part of the initiator port. The output of the dependency block is connected to the initiator retimer block 25.

The target port includes one or more of the following functional blocks:

locking block 26;
access queue block 28;
decode block 30; and
target retimer 32.

Again, not all embodiments of the present invention require the target port to have these functional parts.

The decode block 30 and the access queue block 28 receive an input from the main part of the target port 10. The output of the decode block 30 is connected to the target retimer 32. The output of the access queue block 28 is connected to the dependency block 24 of the initiator port. The locking block 26 and the access queue 28 are connected to the request transport 34. The output of the locking block 26 is connected to the dependency block 24 of the initiator port.

The function of the various functional blocks of the initiator and target ports will be described in more detail hereinafter.

The request transport 34 and the response transport 35 comprise the distributed routing network 4. For clarity, the response transport and the request transport are shown separately. In practice, the request transport and the response transport may be separate or may be, at least partially a shared resource.

A request transport arbiter 38 is provided which arbitrates between the requests of the initiator ports 8 and controls which requests are allowed onto the request transport at a given time which may be a given clock cycle. The request arbiter is connected to the initiator retimer 25 of each initiator port. A request arbiter retimer 40 is also provided between the arbiter 38 and the request transport 34.

A response transport arbiter 42 is also provided which arbitrates between the responses of the target ports 10 and controls which responses are allowed onto the response transport at a given time, for example a clock cycle. The output of each target retimer 32 is connected to the arbiter 42. A response arbiter retimer 44 is also provided between the arbiter 42 and the response transport 35.

It should be appreciated, that at least some of the elements of the model are optional. For example, the access queue in the initiator block may not be present or the access queue in the target port may not be present.

When an integrated circuit having the structure described in relation to FIG. 1 is to be designed, the following steps are performed. These steps define the characteristics of the initiator and target ports, the request and response transports and the relationship between the request and response transport and the initiator and target ports.

A number of parameters are defined. These parameters can be defined by the user or can be produced by a computer program or the like. These parameters describe the system to be built. These parameters can be stored in a file. Locations may be defined in data stores for the values of different parameters. These data stores may be arranged so that different parts of the store are associated with different types of parameter. These parameters can be divided into different categories:

global parameters which relate to the entire system;
initiator port parameters;
initiator port to target resource (request bus) parameters;
target port parameters; and
target port to initiator resource (response bus) parameters.

The first parameter to be defined is a global parameter and applies both to the initiator ports and to the target ports. This parameter is data_width_k which defines the size of a word in the distributed routing network, that is the request transport and response transport of FIG. 2. The sizes of the following fields are related to this parameter and have the following definitions:

the size of the address of a packet in the range 31: data_width_k;

the size of the mask is in the range $(2^{data\_width\_k}-1):0$; and the size of the data is in the range $((8 \times 2^{data\_width\_k})-1):0$.

The value of data_width_k encodes the word size as a function of $2^n$ bytes.

Figure 3A:
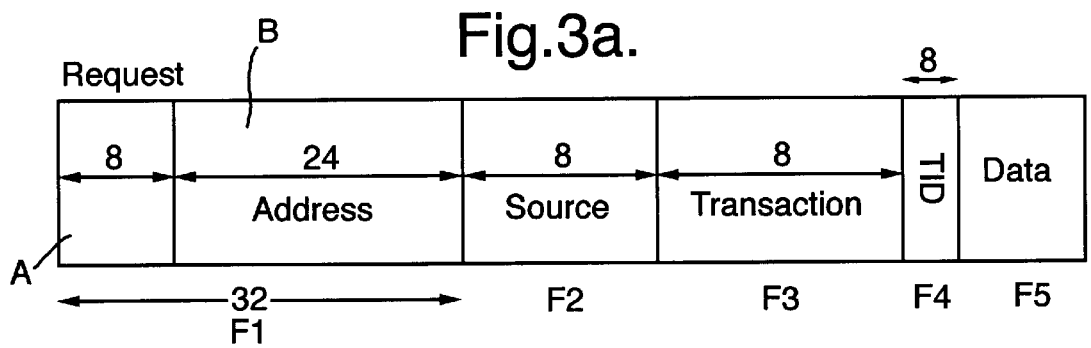
FIG. 3a shows a typical request packet structure.

The structure of typical examples of bus (transport) messages will now be described with reference to FIGS. 3a and 3b. FIG. 3a shows the format of a request packet. The request packet has a first field of F1 of 32 bits. The first 8 bits A are used by the request transport to identify the target and thus route the packet. The remaining 24 bits B, which are sometimes referred to as the address, are used by the target port to identify a location within the associated module or a function of that module. The second 24 bits B are not used by the request transport in order to route the packet.

The request packet also includes an 8 bit source field F2 which identifies the source of the request. In other words, information identifying the initiator port from which the request originates is included. This 8 bit address can take the same format as the 8 bit address A at the head of the packet.

The packet also has an 8 bit field F3 which identifies the type of transaction. In other words, this 8 bit field contains the op-code. One of the bits of the op-code field defines the packet as being a request packet or a response packet. For other bit positions in the op-code field F3 of the request packet, the size and type of the transaction are defined. For example, the code might define the transaction as being a read or a write transaction if the request packet is intended for a memory interface target or a similar target.

The request packet also includes a transaction identifier field F4 which is 8 bits wide. This field is used to identify the transaction number. This allows related transactions to be processed in the correct order.

The request packet may also include a data field F5, which contains data for the target. Only some types of request packets, such as write packets, will contain data. The size of the data field is defined by the data_width_k parameter.

The response packet will now be described with reference to FIG. 3b. The response packet does not have the same address field as a request packet but rather has the 8 bit source field from the request packet as its address in its first field F6. This is used to route the response packet back to the initiator which issued the request. The response packet also has a second 8 bit field F7 which includes an 8 bit opcode. One of the bits of this field will define the transaction as being a response. For responses, only one other bit of the opcode is used and this indicates if the response is a valid response or an error response.

The packet may also include in field F8 n bits of requested data for example in the case of a read request being issued by the requesting module. Not all response packets will include data. The parameter data_width_k defines the size of this field.

Finally, the request packet also includes a transaction identity field F8 which provides transaction identification information. This information may allow related response packets to be sent consecutively on the response transport if required.

Figure 3B:
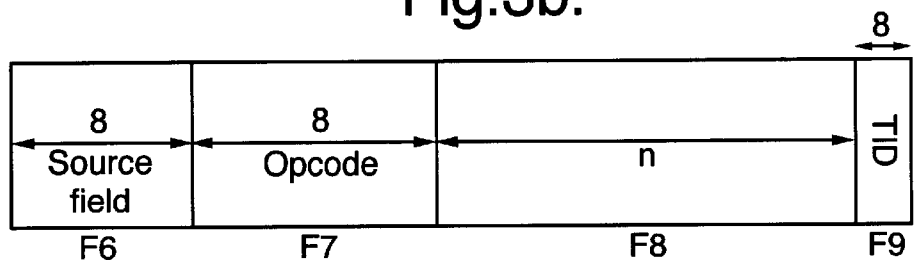
FIG. 3b shows a typical response packet structure.

It should be appreciated that the request and response packets shown in FIGS. 3a and 3b may be replaced by any other suitable packet structure which may have different fields, additional fields or only some of the fields shown in the figures. For example the response and request packets may be provided with an end of packet indicator. The order of the fields in the packets shown in FIGS. 3a and 3b may be different in different embodiments of the present invention. It should be noted that a packet may contain more than one request.

Embodiments of the present invention can be implemented in systems where the requests and responses are not in a packet format.

The parameters which are defined for the initiator ports are as follows:

Firstly, the number of initiator ports 8 is defined. This parameter is initiator_number_k where k is the number of initiator ports.

For each initiator port, the following parameters are defined. These parameters are stored in a hot encoded array. Each element or row of the array corresponds to a respective one of the initiator ports. Each position in the row stores a value of a predetermined parameter.

For each initiator port, it is determined if a retiming stage 25 is required after the address decode and/or dependency stages. The associated parameter is the initiator_retime_k parameter. If the value of this parameter is '0', then no retiming stage 25 is required and the retiming stage 25 is effectively not there. If the value of the parameter is '1', then this will increase the arbitration latency of the associated port by one cycle. In other words, each request from the initiator port is delayed by one cycle before it is presented to the arbiter 38. This has the effect that the address functions are removed from the critical path in the design. It should be appreciated that in alternative embodiments of the present invention, the delay can be selected to be more than one cycle. In alternative embodiments of the invention, the delay is not defined in terms of a clock cycle but in any other suitable manner.

The next parameter to be set is the initiator_ordering_k which is set for each initiator port. If the parameter has the value '1', then the request transport 34 is responsible for ensuring that the requests are in the required time based order. If the parameter has the value '0', then the initiator port is responsible for ensuring that the requests remain in the required order.

For example, the order of the requests may be REQ 1, REQ 2, and REQ 3. When the parameter is '1', the responses will be received by the initiator port in the order RESP 1, RESP 2 and RESP 3. RESP 1 is the response to request REQ 1 and so on. If the parameter is '0', then the responses can be received in any order, for example RESP 2, RESP 3 and RESP 1. The initiator port will reorder the responses to the correct order.

The model is thus able to support both of these methods. Further more this model is able to support both of these methods being used with different initiator ports in the same integrated circuit. This is a particularly advantageous feature of embodiments of the present invention.

Another parameter which is defined for each initiator port is the initiator_queue_depth_k parameter. This determines the maximum length or depth of the access queue block 22. In particular, this defines the maximum number of requests which can be outstanding at a given time. A request remains outstanding until a response has been returned to that request. If the maximum number of requests is outstanding, no further requests will be accepted until one or more of the outstanding requests has received a response.

The parameters which relate to the relationship between the initiator port and the target resource will now be described.

The first one of these parameters is the resource_number_k which defines the number of routing resources available from the initiator port to the target port. This value will be an integer. In preferred embodiments of the present invention, a maximum of one resource is provided for each target from each initiator. In alternative embodiments of the present invention it may be possible to provide more than one resource. Each routing resource is considered as a separate resource for arbitration and corresponds to a transport path. In other words, packets of data from the initiator port are directed to the target path via the transport path or routing resource.

The resource_arbitration_k defines the arbitration model which is used by the arbiter 38. For example if the value of the parameter is '1', then a least recently used mode of arbitration is used. If the parameter has the value '0', a method of arbitration may be used in which the initiator ports have a fixed priority. It should be appreciated that the arbiter is arranged to arbitrate between some or all of the requests from the initiator. More than two methods of arbitration may be provided. The two arbitration methods discussed hereinbefore are only examples and can be replaced by any one or more other arbitration methods.

The resource_retime_k parameter defines whether or not the request arbiter retimer 40 provides any delay or not. If the parameter has the value '1', then the retimer 40 delays the output of the request arbiter 38 by one cycle. This increases the arbitration latency for this resource and all the associated target ports by one cycle. If the parameter has the value '0', then the retimer 40 provides no delay and effectively does not exist.

The final one of these parameters is the resource_mapping_k. This parameter defines the association between the routing resource and the target ports for requests from the initiator port to the target port via the request transport. For a given routing resource x, if a bit associated with a specific target port is set to '1', then that routing resource is associated with that target port. A target port is, in preferred embodiments of the present invention, associated with only one routing resource whilst one routing resource may be associated with one or more target ports. In alternative embodiments of the present invention, a target port may be associated with more than one routing resource. This parameter thus determines for each target port the available routing resource.

The next set of parameters to be set are those relating to the target port.

The first one of these is target_number_k which defines the number of target ports to be provided. Each target port is assigned a row or the like of an array. The values of parameters associated with each target port are stored in the assigned row of the array. Each parameter is associated with a predetermined position in the array. The array may be a hot encoded array. The array may be the same as that used to store parameters relating to the initiator ports.

For each target port, the following parameters are defined. Firstly, the parameter target_ready_k is set. If this parameter has the value '1', then it is assumed that the target device is always ready to receive a request. If the value is set to '0', it is assumed that the target device is only ready to receive a request if it has sent a ready message to the arbiter. This may be sent automatically or in response to a status request.

In one embodiment of the present invention, the integrated circuit is such that the return addressing for the responses from the targets to the initiators is not known. In other words, the return addressing of a response packet in response to a request packet is implicit. In an alternative embodiment of the present invention, the responses have an address portion which identifies the initiator port corresponding to the request associated with the respective returned response.

If the target_retime_k parameter is set to '1', the retimer 32 delays the output of the address decode/dependency stages by a clock cycle. This will have the effect of increasing the arbitration latency for the particular target port by a cycle but removes the address functions from the critical path in the design. If the attribute is set to '0', then the retimer 32 does not provide a delay and is effectively not there.

The target_ordering_k parameter is set to '1' if the target device is required to reorder the responses. This will be required if the initiator_ordering_k parameter is set to 1. If the target_ordering_k parameter is set to zero, the target device will not reorder the responses.

The target_identity_loopback_k parameter is set to '1' if the interconnect i.e. the response transport 35 stores and loop backs the source and identity information associated with the transaction. This will then remove the requirement from the target device. In other words, if the parameter is set to '1', the response transport identifies from where a given request has been received and will direct the response back to the correct initiator. An attribute of a packet may be decoded in order to determine the address to which to return the response. In alternative uses of the model, the addresses will be stored in the queue block 28.

The locking block is provided in those embodiments where the initiator and target ports are to exchange a plurality of requests and/or responses. When the locking mode is selected, no other initiator is permitted to send requests to the target until the exchange of the plurality of responses and requests have been completed.

If the target_identity_loopback_k attribute is '1', the user has to specify the number of possible outstanding requests the target device can support. This is the target_queue_depth_k parameter.

The next group of parameters which need to be set relate to the path between the target port and the initiator port for the response packets.

The first parameter which is set is the return_resources_number_k parameter. This is an integer which defines the number of routing resources between the target port and the initiator port. Each routing resource is considered as a separate resource for arbitration and corresponds to a transport path between the target port and the initiator port. In preferred embodiments of the present invention, the maximum number of resources available to a given target device is one. However, in alternative embodiments more than one resource may be available.

The return_resource_arbitration_k parameter defines the arbitration method used by the response arbiter 42. If the parameter is set to '1', the least recently used arbitration mode is used for arbitrating between the requests from the various target ports 10. If the parameter is set to '0', a simple fixed priority scheme is implemented. One of the target ports is defined to have the highest priority. As with the resource_arbitration_k parameter described hereinbefore, other arbitration schemes may be available or alternatively used.

The return_resource_retime_k parameter is set to '1' if the retimer 44 associated with the response arbiter 42 is to provide a delay of one clock cycle. This will increase the arbitration latency for the response transport 35 and all the associated target ports 10 by one cycle. If the parameter has the value '0' then the retimer 44 does not provide any delay and is effectively not there.

The return_resource_mapping_k parameter defines the association between the routing resource of the response transport 35 and the target ports 10. For a given routing resource N, if the bit associated with the specific target is set to '1', then that routing resource is available for the target device to send its response packets to the initiator port. It should be appreciated that an initiator port may be associated with only one routing resource in preferred embodiments of the present invention. The routing resource may be associated with one or more targets. In alternative embodiments of the present invention, more than one routing resource may be associated with an initiator.

The following parameters define the initiator/target mapping. The forward_decode_f is a mapping function for requests from an initiator port to a target port. In particular, the function defines the mapping between the request packets and the target ports. The same function is used by all initiator ports. However, the initiator identification information (which is included in the request packet) may be used to customise the address map if a specific initiator device requires customisation.

The function provides a one hot encoded array containing one bit per target port. Element 1 of the array corresponds to the first target port and so on until the final element corresponds to the last target port. The request from a given initiator will be mapped to a corresponding one of the target ports. The mapping is point to point which means that a given request from a given initiator can only be mapped to a single target port. In alternative embodiments of the present invention, it may be possible to map a single request to two or more target devices.

If the decode function (carried out by the decode block) is complex or a large number of target ports are instantiated, then the retimer may be set to provide a one cycle delay. The retimer providing the delay may be the response arbiter retimer 44 and/or the target retimer.

The return_decode_f function defines the mapping between the response packets and the target device. Again, the function provides a one hot encoded array including one bit per initiator port. Element 1 of the array corresponds to the first initiator port and the last element corresponds to the last initiator port. Mapping is again preferably point to point and in preferred embodiments of the present invention, mapping a single request to multiple ports is forbidden.

Again, if the decode function is complex or a large number of ports are instantiated, then it may be necessary to ensure that the target retimer and/or the response arbiter retimer delay the packet by at least one cycle.

In embodiments of the present invention, any initiator port is able to communicate with any target port. However it is possible to define for each initiator port which target ports it is able to send requests. Likewise, for each target port it is possible to define from which initiator ports it is able to receive requests.

In embodiments of the invention, the model permits one target port to be in communication with one initiator port at the same time that another target port is in communication with another target port. It is of course possible to use the model in the situation where only one initiator is able to communicate with one target port at one time.

In the model shown in FIG. 2, the request part of the bus is shown separately from the response part of the bus. This model thus can be used to support a split transaction bus where there is a response bus and a request bus. A response can be put on the response bus at the same time that a request is put on the request bus. However it should be appreciated that the model can be adapted to the situation where the responses and the requests share a bus. In this scenario, only one arbiter is provided and it will arbitrate between the requests and the responses to allow access to the bus.

The model shown in FIG. 2 can also be used where there are two or more response or request segments. In other words, if there are two request segments, then one request can be allowed on one request segment at the same time that another request is allowed on another request segment.

The model used in embodiments of the present invention is able to have pipelined processing, non pipelined processing or a mix of the two. The pipelining may be transaction and/or arbitration pipelining. If the processing is pipelined, the retiming stage may provide a delay of one cycle. This retiming, as shown in the model of FIG. 2 may be provided prior to and/or after arbitration. The retiming buffer provided after arbitration may accommodate pipelining in or associated with the target.

The model used in embodiments of the present invention can support ordered or unordered initiator ports and ordered or unordered target ports. In other words the initiator port can support an arrangement in which the responses have to come back in the same order as the corresponding requests were issued or an arrangement in which the responses are able to come back in any order.

A macro is produced from the defined parameters which connects a number of initiator ports to a number of target ports via an interconnect. This allows every initiator to communicate with every target as defined by the address map. All available bandwidth to each target is allocated in dependence on the selected arbitration method. The maximum possible throughput is preferably maintained, up to a maximum or one request/response pair per cycle per interconnect resource. The following properties can be maintained:

for any initiator port, the transactions and locked transactions are maintained as atomic groups—that is the initiator and target are tied to each other until a transaction or a group or locked transactions have been completed;

where initiators are unable to maintain an ordering internally, the interconnect does;

within transactions and locked transaction sequences, ordering can be maintained;

for each initiator port, ordering is maintained and it can also be assumed that each target also maintains ordering so that no access hazards occur, resulting from the incorrect order of requests or responses;

each initiator is able to behave if it is logically independent; and locked sequences of transfers, that is a group of related transactions, are maintained together as atomic groups.

In one version of the model shown in FIG. 2, the access queue block in the initiator port is omitted. This model can be used if the return addressing function for the responses is unknown. In other words, the return addressing of the responses is implicit and full ordering dependency checks are completed. These properties are achieved by using the queue 28 in the target device to track the status and source of every request in the system, create an information database to complete dependency checks and to perform return access mapping using tag based virtual addresses. The source information and the transaction identification information can be used by the target devices to reorder the request and responses.

This requires that the target have storage capacity which is not appropriate in some integrated circuits. In this arrangement, the addressing of the responses uses an internal address.

In an alternative modification to the model shown in FIG. 2, the access queue is not provided in the target port. The access queue is provided in the initiator port. This model may be cheaper to implement in that in the integrated circuit the burden for the transaction ordering is placed on the initiator. If the device does not require the ability to pipeline transactions or is able to support more complex ordering model, the dependency stores may be removed.

Figure 4:
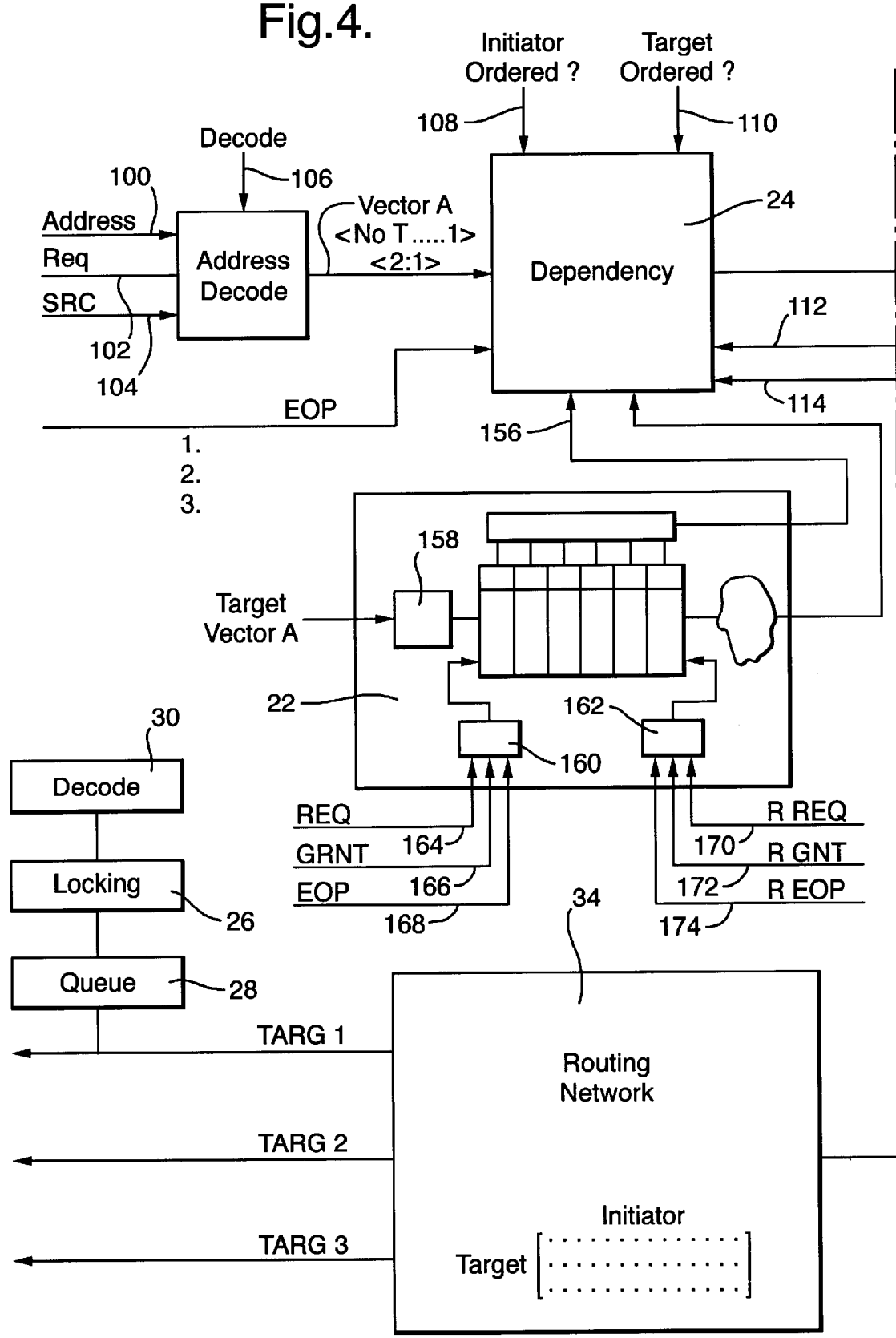
FIG. 4 shows the initiator side of the model of FIG. 2 in more detail.
Figure 4:
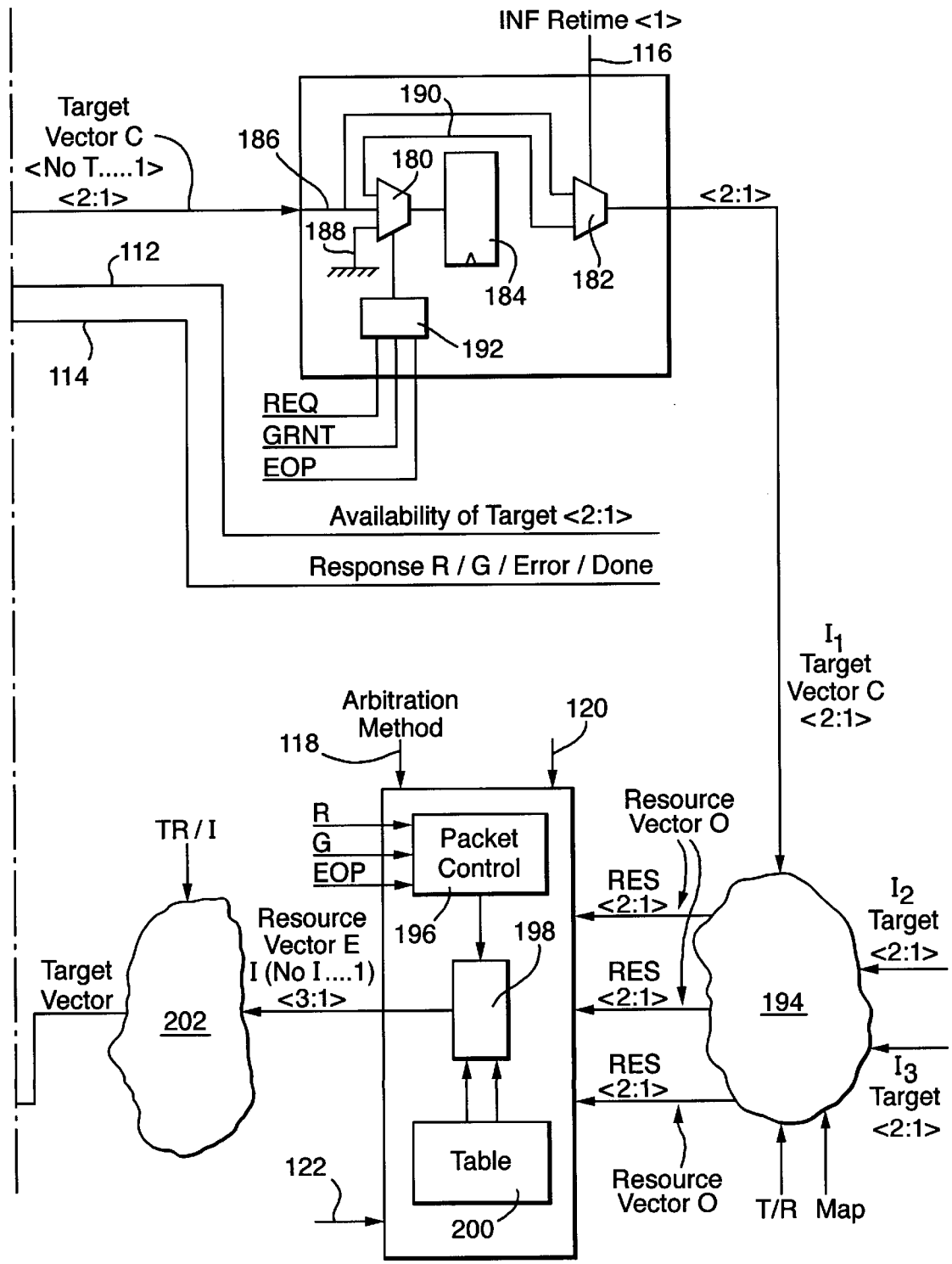

Reference is now made to FIG. 4 which illustrates the concept of the model of FIG. 2 in more detail. It should be appreciated that FIG. 4 illustrates schematically the various steps carried out by the computer program to provide the resulting description.

The address decoder 20 receives the following information:

address of the target port 10 via input 100;

the request to be sent to the target via input 102; and the source of the request via input 104 (this is optional).

The address decoder 20 also receives decode information via input 106 which controls how the address of the target should be decoded. For example, if the address is address 1, then the target is target port 1, if the address is address 2, then the target is target port 2, and so on. The address decoder 20 has a register with one bit per device so that the address decoder 20 can convert the address into the internal address. The target is now defined by one bit. In other words the address decoder converts the address into a one hot encoded vector indicating the target port. The output of the address decoder 20 is a hot encoded vector only one bit of which has the value 1. If bit n of the vector is set to '1', then the request will be routed to target n.

The dependency block 24 looks at the defined properties of the initiator and targets defined by the ordering information and ensures that the routing network or the initiator port orders the responses. The dependency block 24 is able to ensure for example that an initiator port is only able to send a request to a different target when the initiator has received a response from the current target port to which it has sent a packet, if this is required. The dependency block provides a target vector C which defines an allowed request. The output of the dependency stage is target vector C.

The dependency block 24 makes a decision of the allowability of a request. If a request would cause a hazard or a functional error, that request is not presented to the next stage. The information available to the dependency block includes:

- all outstanding accesses from the associated initiator (using response information from the target via input 114);
- the ordering characteristics of the associated initiator and all the target devices (via inputs 108 and 110 respectively);
- the current owner (the initiator currently communicating) of each target.

The dependency block 24 checks if a target port is available to an initiator port (via input 112). The dependency block is also arranged to check if the initiator port supports pipeline accesses and if the initiator port requires the request and response ordering to be preserved.

The dependency block 24 also check if there is an outstanding transaction which could cause an ordering hazard. This uses information in the access queue block 22. An ordering hazard may for example occur if a second request is presented to a target device capable of reordering or a second request from a given initiator is begun on a different target device to the first request. The dependency block is provided with target vector B from the access queue as will be discussed in more detail later.

The dependency block 24 may implement the following rules which are summarised in the table below:

| INITIATOR | TARGET | OUTSTANDING REQUESTS |
|---|---|---|
| ORDERED | ORDERED | AS MANY AS REQUIRED, IF THE PREVIOUS ACCESS IS TO DIFFERENT DEVICE, DELAY UNTIL RESPONSE FROM PREVIOUS REQUEST HAS RETURNED |
| ORDERED | UNORDERED | ONLY ONE AT A TIME |
| UNORDERED | ORDERED | AS MANY AS REQUIRED |
| UNORDERED | UNORDERED | AS MANY AS REQUIRED |

This table summarises the number of outstanding requests which are permitted with various combinations of ordered and unordered initiators and targets. In practice, the number of outstanding requests will be defined by the access queue.

If the initiator wants access to a target which is locked to another target, that initiator is prevented by the dependency unit from presenting the request to another initiator.

For unordered ports, the dependency unit does not contain logic connecting vector A to vector C.

The queue 22 has a defined depth. If the number or requests which have not been serviced exceeds the defined depth, no new requests are accepted until one or more of the outstanding requests have been serviced. The queue is used to control the dependency block 24.

The queue 22 contains a vector FIFO 150. The vector FIFO 150 contains enough space only to accommodate the maximum number of requests. The FIFO also has a portion 152 which indicates for each space allocated to a possible request if that space contains a request. This portion is connected to logic 154 which is able to determine if the FIFO 150 is full or not. The logic 154 provides an output, indicating if the FIFO is full and therefore not able to accept further requests, to the dependency block 24 via connection 156.

The FIFO receives target vector A as an input via controller 158. The controller 158 allows target vector A to be written into the FIFO if it is allowed by the dependency block 24. The dependency block therefore provides the controller 158 with a control signal not shown.

The FIFO is connected to first logic 160 and second logic 162. The first logic receives a request signal, a grant signal and an end of packet signal via lines 164 to 168. A packet may contain more than one request. This logic ensures that where the request and grant signals are '1' and the first request of a packet has been identified, the target associated with target vector A is put into the queue. At all other times, no action is taken by the first logic 160.

The second logic 162 receives a response request signal, a response grant signal and a response end of packet signal via lines 170, 172 and 174 respectively. Again a packet may contain more than one response. The second logic will take out a served request from the FIFO when all three signal are '1'. Thus the request is only removed from the FIFO when the end of the packet containing the responses is received. The FIFO will store in embodiments of the present invention target vector A associated with each response.

The logic OR part of the access queue provides target vector B which defines for which targets there are currently outstanding requests. This information is output to the dependency block 24 which uses this information to prevent a hazard.

If necessary, a retimer stage 25 is connected to the output of the dependency stage. A control signal is provided to the retimer via input 116 which controls the delay provided by the retimer stage 25. The retimer stage 25 has a first multiplexer 182, a second multiplexer 182 and a buffer 184. The first multiplexer 24 receives the output 186 of the dependency block 24, a grounded input 188 and an output 190 of the buffer 184. The control signal for the first multiplexer is provided by a switch 192 which selects one of the request, grant and end of packet signals as a control signal. The switch 192 thus controls the multiplexer to let the appropriate input to the first multiplexer 180 therethrough.

The buffer 184 receives the output of the first multiplexer 180. The buffer 184 provides the delay.

The second multiplexer 182 receives the output of the buffer 184 and the input target vector C from the dependency block 24. If a delay is required, the control signal from line 116 causes the output of the buffer 184 to be output by the second multiplexer 182 and if no delay is required, the second multiplexer outputs the target vector C which has bypassed the buffer. The buffer 184 provides a one cycle delay if required.

The retimer circuit provides an additional lock to stop request ghost duplication from occurring. This can occur where a packet contains more than one request so that more than one response is received to a given packet. A one cycle delay is inserted between subsequent requests. The output of the retimer stage is target vector C which is delayed if required.

The output of the retimer stage 25 is connected a reorganisation part 194 which implements the following:

resource vector D=(resource/target mapping)×(target vector C)

The resource vector D is thus output from the reorganisation part 194 which takes into account the mapping between the resource (interconnect) and the target and the target vector C. The reorganisation part 194 does this for a number of target vectors C associated with different initiators.

The arbiter 38 makes an arbitration decision based on each packet of information. The arbiter uses the following information to make the arbitration decision:

the initiator making the request;
the number of outstanding requests (via input 120) (this is optional);
the availability of the target (via input 122);
the arbiter makes a decision once per packet; and
the arbitration method (defined by input 118).

The arbiter 38 comprises a packet control block 196 which is arranged to maintain packet integrity. In order to perform this function, the packet control block 196 receives the request, grant and end of packet signals. The output of the packet control block is connected to the arbitration algorithm part which also receives the arbitration method signal via line 118, the availability of the target via input 122 and the number of outstanding requests via input 120. The arbitration algorithm part also receives the requests from the various initiators output by the reorganisation part 194.

The arbiter 38 also includes a table 200 which defines the priority of the initiators. The initiator with the highest priority is at the top of the table followed by the initiator with the next highest priority and so on.

The arbitration algorithm used the priority information from the table to allow the initiator with the highest priority which cam make an allowable request to win access to interconnect. The algorithm also decides the priority of the initiators for the next decision and changes the order of the initiators so that the highest priority initiator is at the top of the table. The order of the initiators is determined in accordance with the selected arbitration algorithm. The table thus provides some information regarding the previous history.

The output of the arbiter 38 is thus one request which is resource vector E which represents a request from the initiator which has won the arbitration. The output of the arbiter is input to a remapper 202 which implements the following function:

target vector=(resource/target mapping)$^{-1}$(resource vector)

A delay stage having the same structure as delay stage 25 may be provided here.

The request transport 34 accepts information indicating which initiator is to be connected to which target. The number of connections possible per cycle is determined by the number of connect resources available. In simple systems, this may be a single shared bus for all target devices or in high performance systems a fully connected cross bar may be provided.

If the locking stage 26 is provided, the locked request is passed to a target device. That information is stored here until that lock is released by a second request packet.

Reference will now be made to FIG. 5 which shows the target side of the model of FIG. 2 in more detail.

The address decoder 30 is similar to the address decoder 30 on the initiator side and receives the information identifying the output of the address queue. This provide an output vector takes the same format as that output by the address decoder 20.

The access queue 28 stores information on what request have been made and to which initiator that request is associated. This is used to address response packets back to the initiator port. If the target port is able to return responses out of order, then items are removed from this queue using an associated match on the source and transaction identifier fields of the request. If the target port is not able to return responses out of order, a FIFO can be used. The access queue also provides an output to the dependency block.

The decode block 30 may convert tag information stored in the access queue into a local response address.

The locking block 26 has a bit which indicates if the associated target is locked to a particular initiator and if so the identity of the initiator. This provides an output which is used by the dependency block 24.

The output of address decode block is input to retimer 32 which has the same structure as retimer 25 shown in FIG. 4. The output of the retimer is input to a reorganisation part 220 which has the same structure reorganisation part 194 and which performs the same function. The output of the reorganisation part 194 is connected to the input of the target arbiter 42.

The target arbiter 42 makes the arbitration decision based on the following information:

the target requesting access to the transport resource;
the availability of the initiator;
the arbitration method; and
makes the decision once per packet.

The target arbiter has the same structures as the arbiter 38 of FIG. 4. A retimer stage may be provided after the target arbiter having the same structure as retimer 25 of FIG. 4. A remapper 222 is provided which is similar to the remapper discussed in relation to FIG. 4.

The response transport 35 accepts a two dimensional array of information defining which initiator is connected to which target. The number of connections which are possible in a given cycle are determined by the number of connect resources available. This may be a shared bus or a fully connected cross bar.

The nature of the request and response transport will be determined based on the number of initiators and the number of targets.

The arrangement shown in FIGS. 4 and 5 is able to deal with posted accesses. In the vector stored in the access queue, no bits are set for posted access. However, this posted access reques will be stored. A false response to that request is generated and passed back to the address queue via the target interconnect. This false response causes the request to be removed from the queue. This false response is provided before any true response can be provided. The interconnect also treats the false response as the response. To deal with the subsequent true response a checker can be provided between the target interconnect and the initiator which removes the true response. The true response is thus not presented to the access queue or to the initiator.

The initiator uses posted access when it is not interested in knowing when a request has been performed. The initiator will assume that the request has been acted on correctly. This can be used to achieve pipelining if a response to a request has to be received before a further request is permitted. By using the false response, the system can be speeded up.

It should be appreciated that some of the structures used in the model can advantageously also be used in the final integrated circuit which is manufactured. However the options which are provided in the model will not generally be present in the final product. For example, the integrated circuit can use the arbiter structure described hereinbefore but the arbiter will be programmed with a single arbitration method only. The delay structure will either be present or absent. If present the bypass path is not provided. Other blocks may not require modification when implemented in the integrated circuit.

The model described hereinbefore permits a RTL (Register to transfer level) description of the integrated circuit to be obtained. This is a gate level description of the system.

Alternatively or additionally, this model can be used to obtain a functional description of the system. The functional description will describe how each of the elements of the integrated circuit behave but will not have the timing of the final integrated circuit.

Alternatively or additionally, this model can be used to obtain a performance description of the system. The performance description of the system will include a functional description of the integrated circuit and will include the timing of the final integrated circuit.

The performance and functional descriptions of the system are higher level descriptions of the circuit. These descriptions can be used by other computer programs such as C so as to generate the gate level design of the integrated circuit.

In one embodiment of the invention, the modelling method described hereinbefore is performed a number of times. Each time the method is performed, more parameters are defined or introduced. This allows high level problems to be more quickly identified.

Figure 6:
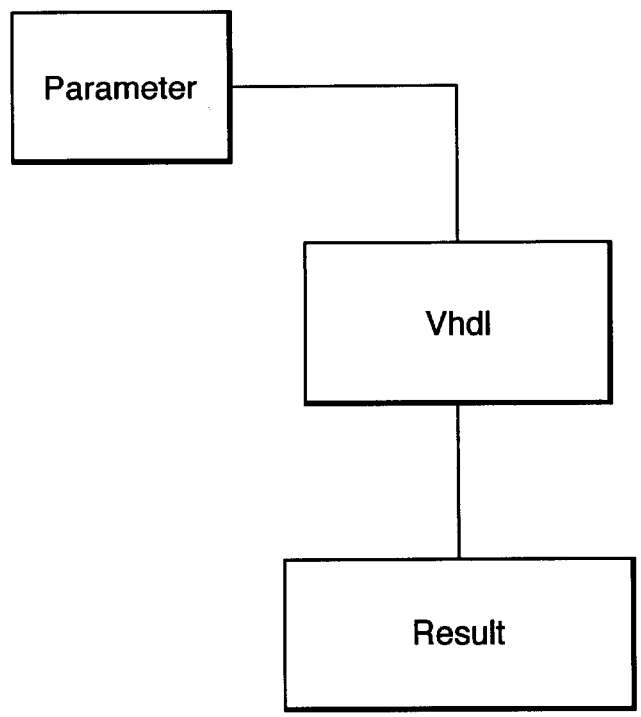
FIG. 6 shows a block diagram illustrating the method embodying the present invention.

Reference will now be made to FIG. 6 which shows how the method is implemented. The values of the parameters described previously are defined and are input to the the model of FIG. 2 which has been defined in the vhdl or similar language. The output of the vhdl program provides a computer net list. This provides a description of the integrated circuit.

It should be appreciate that the various parameters can be set in any suitable order. In the example described hereinbefore, certain values of the parameters are defined as meaning certain specific things. The certain values of the parameters can of course represent something different.

In summary, the model described hereinbefore can provide the following features:

- support for the generation of interconnect routing elements of n×m where n is the number of initiator ports and m is the number of target ports and m and n are integers equal to or greater than 1;
- creation of a fully connected non blocking network supporting up to 2 transfers per target per cycle. A non blocking network is one in which a first initiator can communicate with a first target at the same time that a second initiator can communicate with a second target;
- the selection of the transaction ordering mode for each initiator, that is whether the ordering is enforced by the initiator or the transport;
- the selection of direct or pipelined address (that is whether or not a retiming stage is present) and dependency processing for each initiator port;
- the selection of direct or pipelined arbitration processing for each target port (that is whether or not the arbitration retiming stage is present);
- the selection of the mode of arbitration for each routing element;
- support for locked transaction sequences.

The resultant macro of embodiments of the present invention is a fully synthesisable vhdl module which is referenced directly in the final design. It is possible to define a macro for different sub blocks of the design. Each sub block may be fully defined and independent and may be used to create a design specific implementation.

The interconnect used for testing purposes may be in the form of an AND/OR tree or be tristate or functional multiplexing.

What is claimed is:

1. A method of designing an integrated circuit comprising at least one requester and at least one target, said at least one requester and at least one target being connected by a connection network, said method comprising the steps of:
   - defining at least one parameter for said at least one requester to model said requester;
   - defining at least one parameter for said at least one target to model said target;
   - defining connection information for said connection network to model said network; and
   - producing from said defined parameters and connection information implementation information for implementing said system.

2. A method as claimed in claim 1, wherein said implementation information comprises a gate level description of said system.

3. A method as claimed in claim 1, wherein said implementation information comprises a functional model of said system.

4. A method as claimed in claim 1, wherein said implementation information comprises a synthesisable description of the system.

5. A method as claimed in claim 1, wherein a plurality of requesters and a plurality of targets are provided and one of said requesters can communicate with one of said targets at the same time as another requester is communicating with another target.

6. A method as claimed in claim 1, wherein said system comprises a plurality of modules, each module being a requester and a target.

7. A method as claimed in claim 1, wherein a set of parameters are defined for said at least one requester and said at least one target.

8. A method as claimed in claim 1, wherein said at least one parameter for the at least one requester comprises the number of requesters.

9. A method as claimed in claim 1, wherein the at least one parameter for the at least one requester comprises if a retiming stage is provided in said requester.

10. A method as claimed in claim 1, wherein the at least one parameter for the at least one requester comprises if the requester or the connection network is responsible for maintaining the order of responses to requests issued by a requester.

11. A method as claimed in claim 10, wherein the at least one parameter for the at least one requester comprises defining the maximum number of requests an requester can have outstanding if the connection network is to be responsible for maintaining the order of responses.

12. A method as claimed in claim 1, wherein said at least one parameter for the at least one target comprises the number of targets.

13. A method as claimed in claim 1, wherein the at least one parameter for the at least one target comprises if a retiming stage is provided in said target.

14. A method as claimed in claim 1, wherein the at least one parameter for the at least one target comprises if the target is able to reorder responses.

15. A method as claimed in claim 1, wherein the least one parameter for the at least one target comprises if the connection network is responsible for the routing of responses.

16. A method as claimed in claim 15, wherein the at least one parameter for the at least one target comprises defining the maximum number of requests a target can support if the connection network is to be responsible for routing.

17. A method as claimed in claim 1, wherein said connection information comprises the number of routing resources from the requester to the target.

18. A method as claimed in claim 1, wherein said connection information comprises the number of routing resources from the target to the requester.

19. A method as claimed in claim 1, wherein said connection information comprises routing information for routing a request from said requester to said target.

20. A method as claimed claim 1, wherein said connection information comprises routing information for routing a response from said target to the requester.

21. A method as claimed in claim 1, wherein said connection information comprises information associating a respective requester and target with a routing resource of the connection network.

22. A method as claimed in claim 1, wherein said connection information comprises the arbitration method to be used to arbitrate between the requests for access to said connection network.

23. A method as claimed in claim 22, wherein said connection information comprises if a delay is to be introduced after arbitration.

24. A method as claimed in claim 1, wherein said connection network comprises a bus.

25. A method as claimed in claim 1, wherein said method is performed a plurality of times, each successive performance of said method using more information defining at least one of said target model, said requester model and said connection network model.

26. A model for use in designing an integrated circuit comprising at least one requester and at least one target connected by a connection network, said model comprising:

a requester model, one requester model being provided for each requester;

a target model, one target model being provided for each target; and a connection network model, wherein at least one of the requester model, the target model and the connection model have has one or more parameters defining the behaviour of the respective model, at least one of said parameters being selectable.

27. A model as claimed in claim 26, wherein the connection network model comprises an arbiter for arbitrating between access to said connection network.

28. A model as claimed in claim 27, wherein the arbiter is arranged to perform one of a number of different arbitration methods supportable by said network.

29. A model as claimed in claimed in claim 26, wherein requester is selected to be ordered or unordered.

30. A model as claimed in claim 26, wherein the connection network is selected to be ordered or unordered.

31. A model as claimed in claim 26, wherein the target is selected to be ordered or unordered.

32. A model as claimed in claim 31, wherein a plurality of requesters and a plurality of targets are provided, at least one of which is ordered and at least one of which is unordered.

* * * * *